United States Patent [19]

Yamashita et al.

[11] Patent Number: 4,726,072

[45] Date of Patent: Feb. 16, 1988

[54] DOUBLE CONVERTER TUNER

[75] Inventors: Sadahiko Yamashita, Kanagawa; Makoto Hasegawa, Tokyo; Motoi Ohba; Tsutomu Shishido, both of Kanagawa; Yasumasa Watanabe, Osaka, all of Japan

[73] Assignee: Matsushita Electric Industrial Co., Ltd., Osaka, Japan

[21] Appl. No.: 4,802

[22] Filed: Jan. 9, 1987

Related U.S. Application Data

[63] Continuation of Ser. No. 635,292, Jul. 27, 1984, abandoned.

[30] Foreign Application Priority Data

Jul. 28, 1983 [JP] Japan .............................. 58-138021
Sep. 8, 1983 [JP] Japan .............................. 58-165548
Sep. 22, 1983 [JP] Japan .............................. 58-175337

[51] Int. Cl.⁴ .......................... H04B 11/16; H04B 1/26
[52] U.S. Cl. .................................... 455/189; 455/197; 455/315; 455/340
[58] Field of Search ............... 455/131, 189, 190, 314, 455/315, 316, 197, 301, 327, 340, 266, 330, 183, 339

[56] References Cited

U.S. PATENT DOCUMENTS

| | | | |
|---|---|---|---|
| 3,327,222 | 10/1963 | King, Jr. .............................. | 455/315 |
| 4,162,452 | 7/1979 | Aslt .................................... | 455/315 |
| 4,352,709 | 9/1982 | Ma ...................................... | 455/315 |
| 4,402,089 | 8/1983 | Knight et al. ....................... | 455/340 |
| 4,418,427 | 11/1983 | Muterspaugh ...................... | 455/340 |
| 4,418,428 | 11/1983 | Evans .................................. | 455/340 |
| 4,429,418 | 1/1984 | Hooper ................................ | 455/314 |
| 4,435,841 | 3/1984 | Dobrovolny ........................ | 455/190 |
| 4,491,976 | 1/1985 | Saitoh et al. ....................... | 455/316 |
| 4,512,035 | 4/1985 | Victor et al. ....................... | 455/316 |
| 4,521,916 | 6/1985 | Wine ................................... | 455/316 |
| 4,556,988 | 12/1985 | Yoshisato ........................... | 455/183 |

OTHER PUBLICATIONS

"A Frequency Synthesizer for TV Receivers," Breeze et al., 9/74, p. 1.

Primary Examiner—Robert L. Griffin
Assistant Examiner—Curtis A. Kuntz
Attorney, Agent, or Firm—Burgess, Ryan & Wayne

[57] ABSTRACT

Disclosed is a double converter tuner having an input circuit for performing first band control with respect to an input signal, amplifying a band-controlled input signal after automatic gain control is performed, and further performing second band control of a gain-controlled signal, a first IF (intermediate frequency) converter for converting an output generated from the input circuit to a first IF signal having a higher bandwidth than the reception bandwidth of the input signal, a first IF circuit for amplifying an output from the first IF converter, performing third band control and performing a further amplification, a second IF converter for converting an output generated from the first IF circuit to a second IF signal, and a second IF circuit for amplifying an output from the second IF converter, performing fourth band control, and performing another amplification. The first and second IF converters are arranged on different circuit boards to prevent frequency interference therebetween.

21 Claims, 13 Drawing Figures

FIRST IF CIRCUIT

FIG. 5

SECOND IF CIRCUIT

DOUBLE CONVERTER TUNER

This application is a continuation of application Ser. No. 635,292 filed July 27, 1984, now abandoned.

BACKGROUND OF THE INVENTION

The present invention relates to a double converter tuner for receiving a television signal such as a CATV signal having a wide bandwidth.

TV tuners using a double converter system have been recently used as wide-band tuners.

In a conventional double converter tuner, an unnecessary channel band of an input TV signal ($f_{RF}$) is attenuated through a band-pass filter, and the filtered signal is frequency-converted to a first intermediate frequency or IF ($f_{I1}$) signal having a frequency which is several times the input TV signal. An unnecessary frequency component of the first IF signal is removed by an IF filter. The filtered first IF signal is converted to a second IF signal having a standard intermediate frequency $f_{I2}$.

In the double converter system having the configuration described above, a spurious component is easily generated by the input signal and local oscillation signals from the two IF converters when the first intermediate frequency is lowered. In order to remove the spurious component, the performance of the IF filter must be improved. However, improvement in filter performance results in a large size of the device. In addition, the band characteristics of the IF filter greatly influence interference characteristics. Therefore, an attenuation band must have a high suppression coefficient, and a loss in the passband becomes large. As a result, a noise factor (NF) is increased. Furthermore, frequency interference between a local oscillator of a first IF converter and a local oscillator of a second IF converter tends to occur, so that complete and comprehensive shielding must be performed. In addition to this disadvantage, the filter or the like in the input section has a wide band, and a specific frequency band is not selected. Therefore, the input section cannot remove interference waves.

In the conventional system of this type, an interference removal capacity, suppression of a spurious component, cross modulation characteristics, intermodulation characteristics, and the like must be improved.

SUMMARY OF THE INVENTION

The present invention has been made to eliminate the conventional problems described above, and has as a first object to provide a compact, high-performance double converter tuner capable of removing unnecessary radiation and interference waves.

It is a second object of the present invention to provide a double converter tuner capable of easily removing frequency interference between a first local oscillation source and a second oscillation source and of preventing degradation of a noise figure (NF) of the first IF filter.

According to an aspect of the present invention, a tuner comprises: an input circuit having first band controlling means for performing a first band control with respect to an input signal, automatic gain controlling means for automatically gain-controlling an output from said first band controlling means, input signal amplifying means for amplifying an output from said automatic gain controlling means, and second band controlling means for performing second band control with respect to an output from said input signal amplifying means; first intermediate frequency converting means for converting an output from said input circuit to a first intermediate frequency higher than a frequency of the input signal; a first intermediate frequency circuit having means for amplifying an output from said first intermediate frequency converting means, means for performing third band control, and means for amplifying an output from said third band controlling means; second intermediate frequency converting means for converting an output of said first intermediate frequency means to a second intermediate frequency; and a second intermediate frequency circuit having means for amplifying an output from said second intermediate frequency converting means, means for performing fourth band control and means for amplifying an output from said fourth band controlling means. In order to more effectively achieve a preferable arrangement of the second embodiment, the first intermediate frequency converting means is arranged on a first circuit board, the second intermediate frequency converting means is arranged on a second substrate, and the third frequency controlling means is arranged between the first and second circuit boards.

According to another aspect of the present invention, a tuner comprises: first intermediate frequency converting means having a first local oscillator, a first amplifier for amplifying an output from said first local oscillator, a first mixer for mixing the output from said first amplifier and an input television signal and converting the input signal to a first intermediate frequency signal, and a second amplifier for amplifying an output from said first mixer; a first intermediate band-pass filter for filtering an output generated from said first intermediate frequency converting means; and second intermediate frequency converting means having a second local oscillator, a third amplifier for amplifying an output from said second local oscillator, and a second mixer for mixing an output signal from said third amplifier and a signal generated from said first intermediate frequency band-pass filter and converting the signal from said first intermediate frequency band-pass filter to a second intermediate frequency signal, said first and second intermediate frequency converting means being arranged on first and second circuit boards, respectively, and said first intermediate frequency band-pass filter being arranged between said first and second substrates.

DETAILED DESCRIPTION OF THE PREFERRED EMBODIMENTS

In order to best understand the present invention, the conventional problems will first be described in detail with reference to the accompanying drawings.

Figure 1:
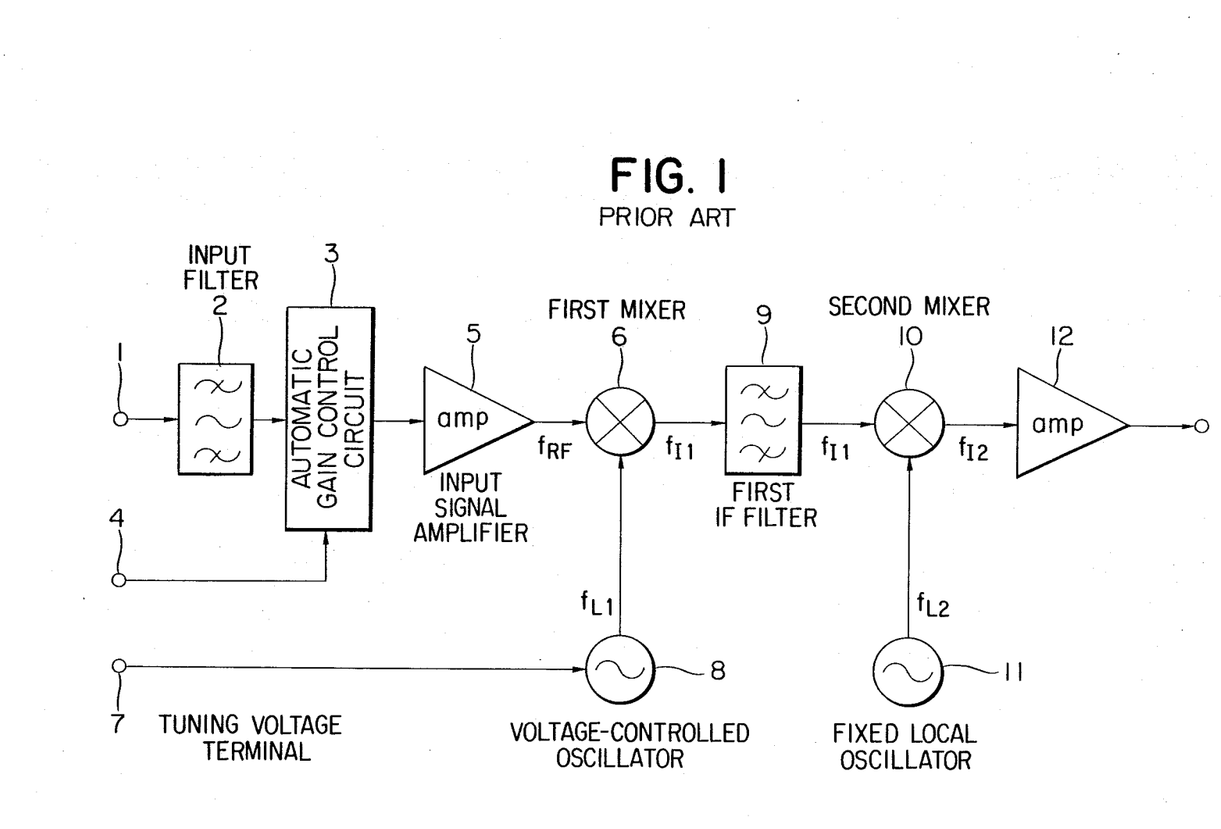
FIG. 1 is a block diagram of a conventional double converter tuner.

FIG. 1 is a block diagram of a conventional double converter TV tuner.

Referring to FIG. 1, an unnecessary frequency band of a TV signal ($f_{RF}$) supplied from an input signal terminal 1 is attenuated by a band-pass or input filter 2. An automatic gain control circuit 3 controls a gain required for the tuner in accordance with a level supplied from a gain control terminal 4 especially when a large input is supplied thereto. A gain-controlled signal is amplified by an input signal amplifier 5, and an amplified signal is supplied to a first mixer 6. In the first mixer 6, the output from the input signal amplifier 5 is mixed with an oscillation output ($f_{L1}$) from a voltage-controlled oscillator 8 as a first local oscillation source which is controlled by a voltage applied from a tuning voltage terminal 7. The first mixer 6 generates a first IF signal ($f_{I1}$). An unnecessary frequency component of the first IF signal is removed by a first IF filter 9, and the filtered first IF signal is supplied to a second mixer 10. The second mixer 10 frequency-converts the filtered first IF signal by using an oscillation output ($f_{L2}$) from a fixed local oscillator 11. The second mixer 10 then generates a second IF signal ($f_{I2}$). The second IF signal ($f_{I2}$) has a standard intermediate frequency. The second IF signal is amplified by a second intermediate amplifier 12 which then generates a tuner output. The double converter system described above is suitable for widening the frequency band of the input signal. When the first IF signal ($f_{I1}$) has a frequency which is several times the input frequency of the input signal, the oscillation frequency ($f_{L1}$) of the voltage-controlled oscillator 8 becomes higher than the first IF signal ($f_{I1}$). Therefore, a spurious component as a disadvantage in the super heterodyne system can be removed within the application frequency band.

In the double converter system having the arrangement described above, the unnecessary signal (spurious component) is easily generated by the interference between the input signal and the two local oscillation signals when the first intermediate frequency is low. In order to remove this spurious component, the performance of the IF filter 9 must be improved, but the device as a whole becomes large in size. The input filter 2 or the like does not select only a specific band but receives a wide-band signal. The input filter 2 thus cannot eliminate an interference wave.

The interference wave removal capacity, suppression of the spurious component, cross modulation characteristics and intermodulation characteristics are very important factors in the tuner of this type. Various types of improvement must be achieved.

In addition, frequency interference between the voltage-controlled oscillator 8 and the fixed local oscillator 11 as the second local oscillation source tends to occur, so that comprehensive shielding must be provided.

In addition to the above disadvantages, the band characteristics of the first IF filter 9 greatly influence the interference characteristics, thus requiring a high suppression coefficient of an attenuation band. Furthermore, a loss in the passband is increased. As a result, the degradation of the noise figure (NF) is increased.

The present invention has been made to eliminate these conventional drawbacks.

A double converter tuner according to an embodiment of the present invention will be described with reference to the accompanying drawings.

Figures 2, 3:
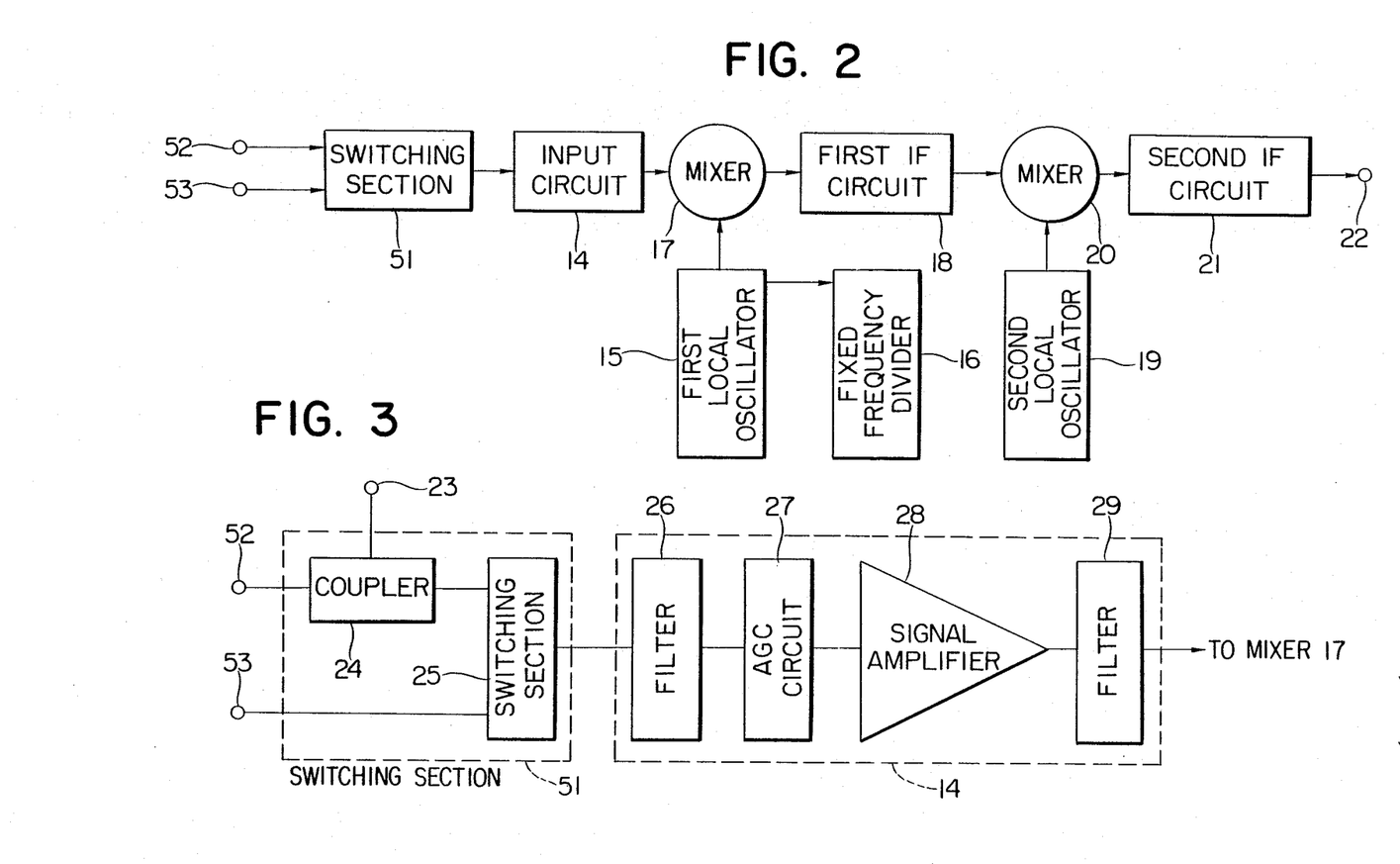
FIG. 2 is a block diagram of a double converter tuner according to an embodiment of the present invention.
FIG. 3 is a block diagram of a switching circuit and an input circuit of the tuner shown in FIG. 2.

FIG. 2 is a block diagram of a double converter tuner according to an embodiment of the present invention.

Referring to FIG. 2, reference numeral 51 denotes a switching section for selecting one of input terminals 52 and 53 for receiving an input signal; 14, an input circuit for processing an output from the switching section 51 in a manner as will be described later; and 15, a first local oscillator which comprises a voltage-controlled oscillator (VCO). Reference numeral 16 denotes a fixed frequency divider for frequency-dividing part of the output from the first local oscillator 15 at a fixed frequency division ratio. The fixed frequency divider 16 constitutes part of a PLL (phase-locked loop) frequency synthesizer. Reference numeral 17 denotes a mixer for mixing the first oscillation signal from the first local oscillator 15 with the output from the input circuit 14 and for generating a first IF signal that is, reference numeral 17 denotes an IF generating circuit or an RF-to-IF converting circuit; 18, a first IF circuit for selecting a predetermined one of the channels from the first IF signal from the first mixer 17 and amplifying the selected channel; 20, a mixer for mixing a second oscillation signal from a second local oscillator 19 with the output from the first IF circuit and generating a second IF signal; and 21, a second IF circuit for selecting another predetermined one of the channels from the second IF signal from the second mixer 20 and amplifying a selected channel signal. The amplified channel signal appears at an output terminal 22.

In the above circuit arrangement, the input signal is selected by the switching section 51 through the input terminals 52 and 53, and is supplied to the input circuit 14. The input circuit 14 performs predetermined processing, and the processed signal is mixed by the first mixer 17 with the oscillation signal from the first local oscillator 15. The first mixer 17 then generates a first IF signal.

On the other hand, the fixed frequency divider 16 receives part of the output from the first local oscillator 15 and frequency-divides this input signal thereto. This fixed frequency divider 16 constitutes part of a PPL frequency synthesizer (to be described later). A desired one channel band of an output signal from the mixer 17 which has the first intermediate frequency is selected by the first IF circuit 18. The selected channel signal is amplified and is supplied to the second mixer 20. The second mixer 20 decreases the first intermediate frequency to a second intermediate frequency in response to the oscillation signal from the second local oscillator 19. The second IF signal is selected and amplified by the second IF circuit 21, and a predetermined intermediate frequency signal appears at the output terminal 22.

The functions of the respective components shown in FIG. 2 will be described in detail with reference to FIGS. 3 to 7.

Figure 13:
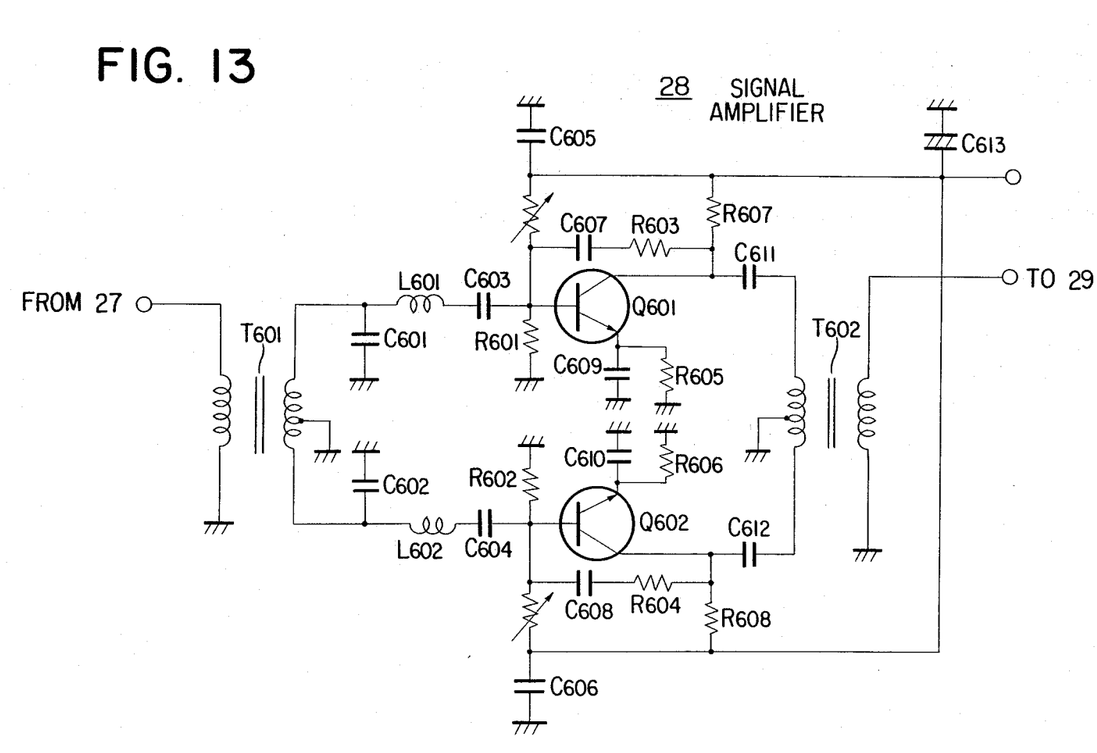
FIG. 13 is a circuit diagram of a signal amplifier of the input circuit.

Referring to FIG. 3, the switching section 51 and the input circuit 14 will first be described. As shown in FIG. 3, the input signal is applied to the two input terminals 52 and 53. The signal applied to the input terminal 52 is processed by a coupler 24 and appears as a data output at a data input/output terminal 23. A switching section 25 selects one of the input signals, and a selected signal is supplied to a filter 26. The filter 26 basically comprises a low-pass filter for passing a signal within a reception band. A cutoff frequency of the low-pass filter can be variable. Thereafter, an AGC circuit 27 performs gain control, and a gain-controlled signal is amplified by a signal amplifier 28. An amplified signal is supplied to a filter 29. When the signal amplifier 28 comprises a push-pull amplifier shown in FIG. 13, current consumption is increased, and the noise figure (NF) is slightly degraded by about 0.5 dB. However, a second-order intermodulation can be greatly improved by, for example, about 20 dB. For example, the bandwidth of the reception signal is divided into a first range of 54 to 102 or 108 MHz, a second range of 102 or 108 MHz to 252 or 282 MHz, and a third range of 252 or 282 MHz to 456 MHz. The filter 29 comprises three band-pass filters having the bandwidths respectively corresponding to these ranges. The filter 29 has a switching means for allowing selective use of the three band-pass filters. The filter 29 also has a varactor diode (not shown) which can provide a variable bandwidth. An output from the filter 29 is supplied to the mixer 17 shown in FIG. 2.

Figure 4:
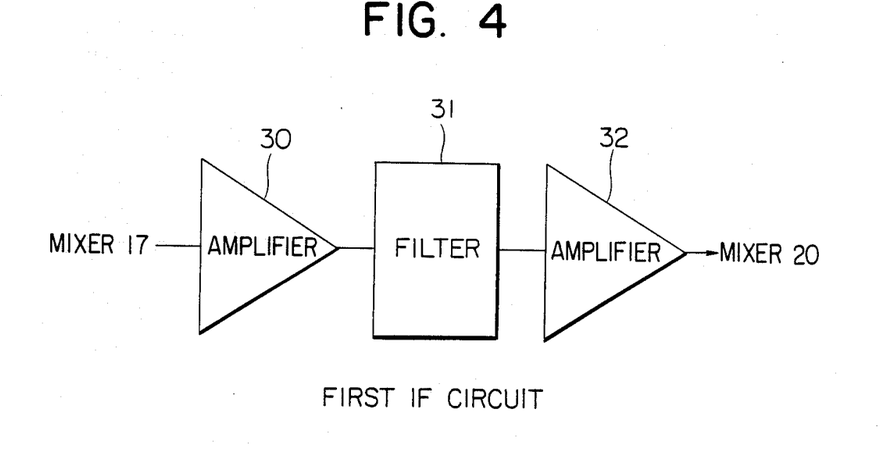
FIG. 4 is a block diagram of a first IF circuit of the tuner shown in FIG. 2.

The first IF circuit 18 will be described with reference to FIG. 4. As shown in FIG. 4, an output signal from the mixer 17 is amplified by an amplifier 30, and a band-pass filter 31 selects a desired one of the channels. The filter 31 has a bandwidth of 6 MHz and comprises a dielectric material having a compact construction, a low dielectric loss and a high dielectric constant. For example, a dielectric constant $\epsilon_\lambda = 35$, and tan $\delta = 1 \times 10^{-4}$. Thereafter, an output from the filter 31 is amplified by an amplifier 32, and an amplified output is applied to the second mixer 20 shown in FIG. 2.

Figure 5:
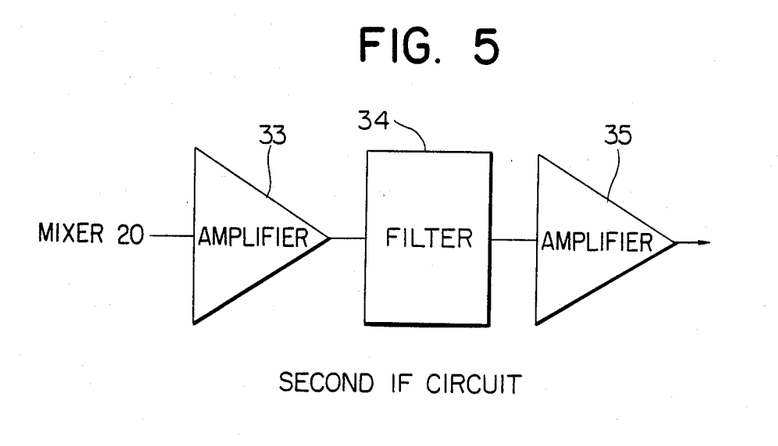
FIG. 5 is a block diagram of a second IF circuit of the tuner shown in FIG. 2.

The second IF circuit 21 will be described with reference to FIG. 5.

A signal converted by the mixer 20 to the second IF signal is amplified by an amplifier 33. Audio and video signals of the adjacent channels which interfere with those of the desired band are removed by a band-pass filter 34. The signal filtered by the band-pass filter 34 is amplified by an amplifier 35, and an amplified signal appears at the output terminal 22 shown in FIG. 2. It should be noted that the filter 34 comprises, for example, a combination of a band-pass filter and an interference wave blocking filter.

Figure 6:
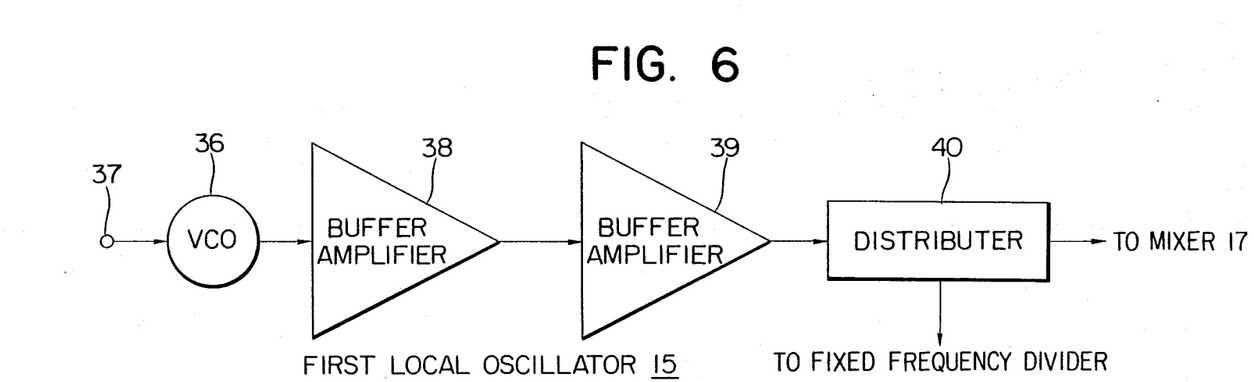
FIG. 6 is a block diagram of a first local oscillator of the tuner shown in FIG. 2.

The first local oscillator 15 will be described with reference to FIG. 6. As shown in FIG. 6, the oscillation frequency of the first local oscillator 15 is controlled by a voltage from a terminal 37 applied from a varactor diode (not shown). An output from a VCO 36 is amplified by a two-stage amplifier circuit which comprises buffer amplifiers 38 and 39. An amplified output from the buffer amplifier 39 is distributed by a distributor 40 into two signal components. Most of the signal from the distributor 40 is used to drive the first mixer 17 shown in FIG. 2, and the remaining portion is used as a signal source for constituting the PLL frequency synthesizer and is supplied to the fixed frequency divider 16.

The second local oscillator 19 will be described with reference to FIG. 7.

Figure 7:
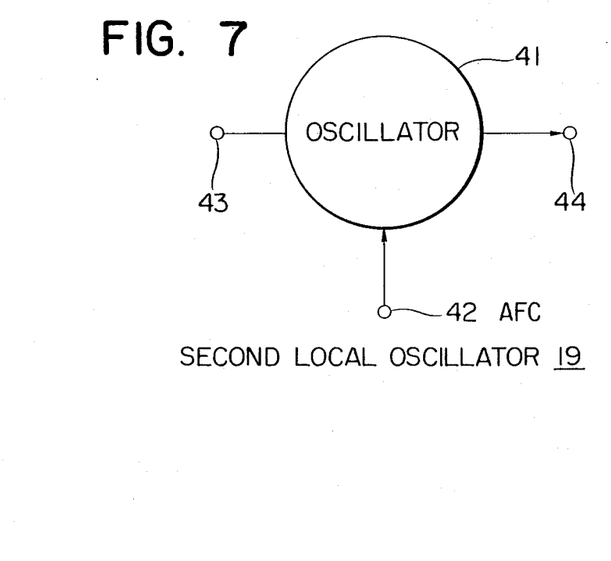
FIG. 7 is a block diagram of a second local oscillator of the tuner shown in FIG. 2.

As shown in FIG. 7, in the second local oscillator 19, a varactor diode (not shown) is connected to an oscillator 41, and an AFC signal is received at an AFC signal terminal 42, thereby stabilizing the receiver as a whole in accordance with the AFC system. A mechanical tuning mechanism 43 is connected to the oscillator for fine adjustment, thereby simplifying frequency setting on a mass production line. An output from the second local oscillator 19 is supplied to the second mixer 20 of FIG. 2 through a terminal 44.

Figure 8:
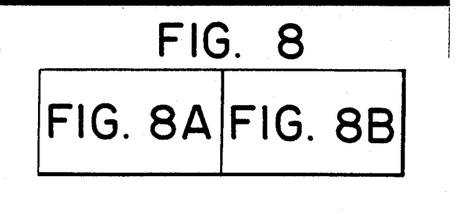
FIG. 8 is a circuit diagram of the tuner shown in FIG. 2.
Figure 8A:
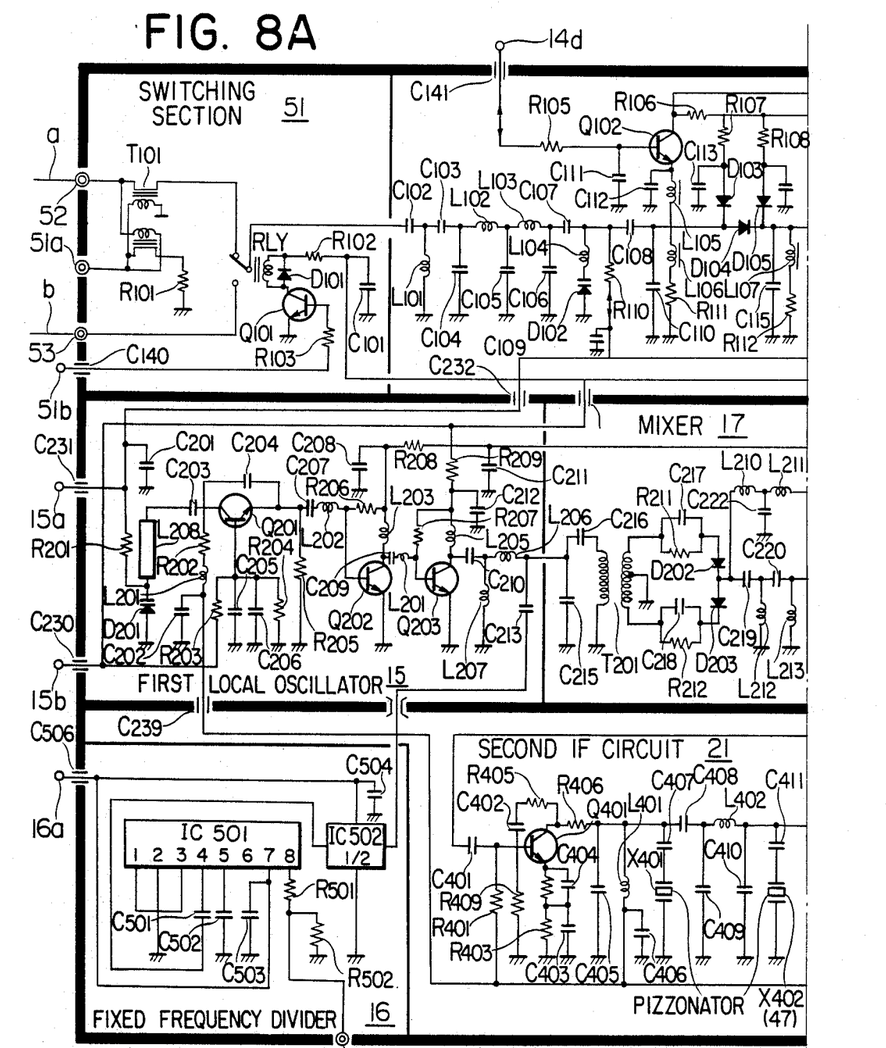
Figure 8B:
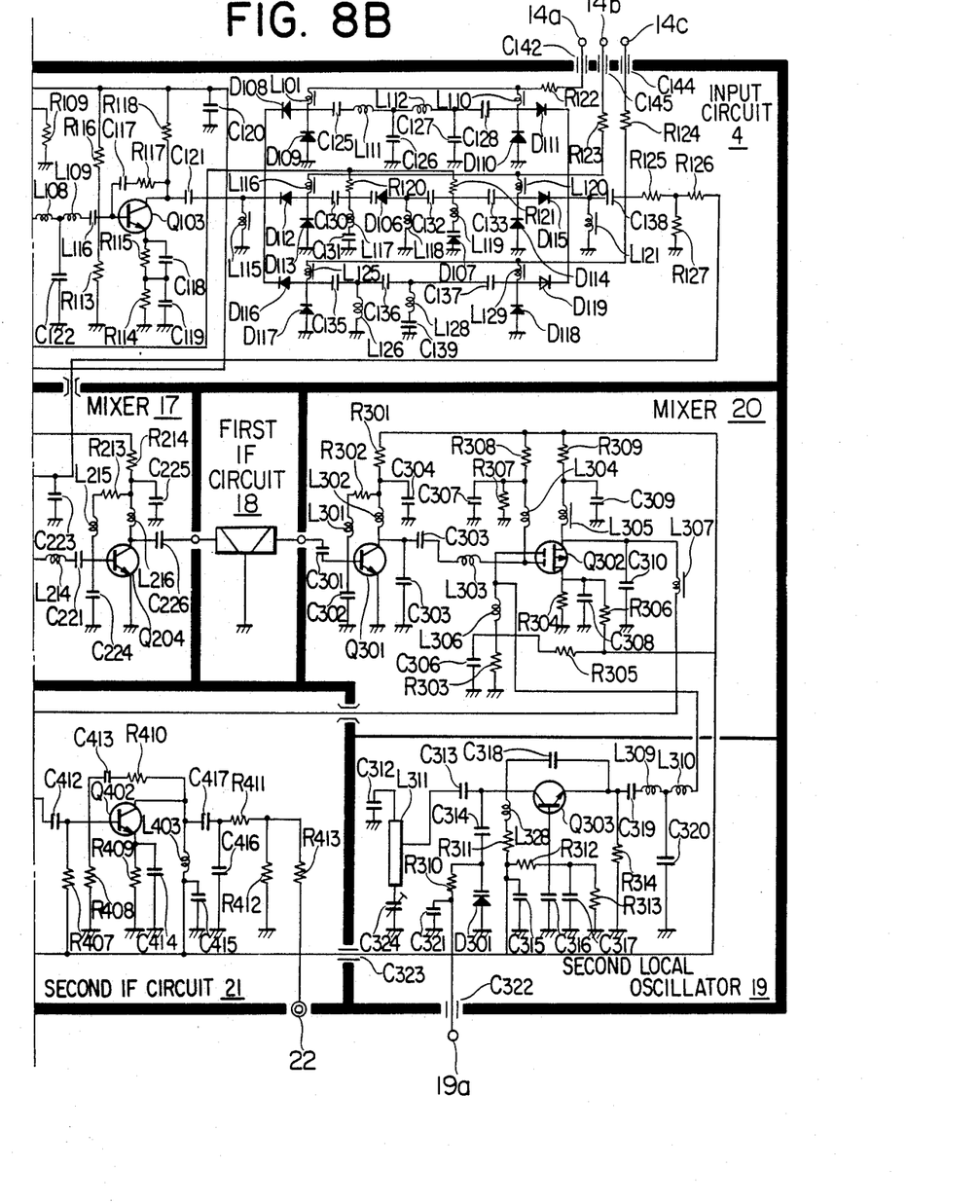

FIG. 8 is a circuit diagram of the double converter tuner shown in FIG. 2.

The circuit shown in FIG. 8 comprises the switching section 51, the input terminals 52 and 53, the input circuit 14, the first local oscillator 15, the fixed frequency divider 16, the first and second mixers 17 and 20, the first IF circuit 18, the second local oscillator 19 and the second IF circuit 21, as in the case of FIG. 2.

When two types of input signals are used, one of the signals is selected by the switching section 51. More specifically, input signals a and b are supplied to the switching section 51 respectively through the input terminals 52 and 53 and are switched by a relay circuit controlled by a switching signal supplied to a terminal 51b. The relay circuit comprises a relay RLY and a transistor $Q_{101}$ for driving the relay RLY. The transistor $Q_{101}$ is turned on/off in response to the switching signal supplied to the terminal 51b so as to drive the relay RLY. The contacts of the relay RLY are switched. It should be noted that part of the input signal a is extracted as a data signal at an input/output terminal 51a by means of a branching filter.

In the input circuit 14, a component of the signal from the switching section 51 which falls within the reception bandwidth is filtered by a first band control section which comprises a high-pass filter of capacitors $C_{102}$ and $C_{103}$ and an inductor $L_{101}$, a low-pass filter of capacitors $C_{104}$ to $C_{106}$ and inductors $L_{102}$ and $L_{103}$, and a notch filter of an inductor $L_{104}$ and a varactor diode $D_{102}$. The cutoff frequency of the first band control section can be varied when a control voltage from a terminal 15a is supplied to the varactor diode $D_{102}$ through a resistor $R_{110}$. Thereafter, an output from the first band control section is supplied to an AGC circuit including a transistor $Q_{102}$, capacitors $C_{110}$ to $C_{115}$, resistors $R_{105}$ to $R_{109}$ and $R_{111}$ and $R_{112}$, inductors $L_{105}$ to $L_{107}$ and a diode $D_{105}$ and is gain-controlled thereby in response to the AGC signal from a terminal 14d. An output from the AGC circuit is amplified by a signal amplifier including a transistor $Q_{103}$, capacitors $C_{116}$ to $C_{121}$ and resistors $R_{113}$ to $R_{118}$. When this signal amplifier comprises a push-pull amplifier shown in FIG. 13, current consumption is increased, and the noise figure is slightly degraded by about 0.5 dB. However, second-order intermodulation is greatly improved by, for example, about 20 dB. An output from the signal amplifier is supplied to the first mixer 17 through a second band control section. The second band control section comprises three filters having different filtering bandwidths which are selectively switched in accordance with the reception frequency. The first filter in the second band control section comprises a band-pass filter which has a frequency range of 54 MHz to 102 MHz and which has capacitors $C_{125}$ to $C_{128}$ and inductors $L_{111}$ and $L_{112}$. The second filter in the second band control section comprises a band-pass filter which has a frequency range of 102 MHz to 252 or 282 MHz and which has capacitors $C_{130}$ to $C_{133}$, varactor diodes $D_{106}$ and $D_{107}$ and inductors $L_{117}$ to $L_{119}$. The third filter in the second band control section comprises a band-pass filter which has a frequency range of 252 or 282 MHz to 456 MHz and which has capacitors $C_{135}$ to $C_{137}$ and $C_{139}$ and inductors $L_{126}$ and $L_{128}$. The selection of these three band-pass filters is controlled by a diode switching circuit which is controlled in response to control signals supplied to terminals 14a, 14b and 14c. This diode switching circuit comprises diodes $D_{108}$ to $D_{119}$ and choke coils $L_{110}$, $L_{113}$, $L_{116}$, $L_{120}$, $L_{125}$ and $L_{129}$ in a manner illustrated in FIG. 8. A gain of the input section 14 is about 10 dB without AGC.

On the other hand, the first local oscillator 15 comprises a VCO which includes a transistor $Q_{201}$, capacitors $C_{202}$ to $C_{207}$, a varactor diode $D_{201}$, an inductor $L_{201}$, a resonant line $L_{208}$, and resistors $R_{202}$ to $R_{205}$. This VCO oscillates at a frequency falling within the range of 1,554 to 1,956 MHz, and this frequency is controlled by a control input to the synthesizer which is applied to the terminal 15a. An output from the VCO is amplified by a two-stage amplifier which includes transistors $Q_{202}$ and $Q_{203}$, capacitors $C_{208}$ to $C_{212}$, inductors $L_{202}$ to $L_{205}$ and resistors $R_{206}$ to Rhd 209. An amplified signal from the two-stage amplifier is supplied to the fixed frequency divider 16 and the mixer 17. The terminal 15b is a DC power supply voltage applying terminal which receives a voltage of, for example, DC 12 V.

The fixed frequency divider 16 includes an input-stage integrated circuit IC502 of an astable multivibrator, an output-stage frequency-dividing integrated circuit IC501, capacitors $C_{501}$ to $C_{503}$ and resistors $R_{501}$ and $R_{502}$. A power supply voltage is applied to a terminal 16a, and a PPL signal as a frequency-divided output is generated from a terminal 16b.

In the mixer 17, the signal from the input circuit 14 is mixed with the output signal from the first local oscillator 15 by a diode mixer which includes capacitors $C_{215}$ to $C_{218}$, a transformer $T_{201}$, resistors $R_{217}$ and $R_{218}$ and diodes $D_{202}$ and $D_{203}$. The diode mixer increases the frequency of the signal from the input circuit 14 to the first IF frequency (1,400 to 1,600 MHz) of, for example, a 1.5 GHz band. The first IF signal is amplified by a single-stage intermediate amplifier including a transistor $Q_{204}$, capacitors $C_{224}$ to $C_{226}$, inductors $L_{215}$ and $L_{216}$ and resistors $R_{213}$ and $R_{214}$. An amplified signal is supplied to the first IF circuit 18.

A desired channel of the first IF signal from the first mixer 17 is selected by the first IF circuit 18. The first IF circuit 18 comprises a dielectric coaxial type band-pass filter which has a bandwidth of 6 MHz and an insertion loss of 5 dB. Thereafter, the first IF signal is supplied to the second mixer 20.

In the second mixer 20, the first IF signal is amplified by an amplifier which includes a transistor $Q_{301}$, capacitors $C_{301}$ to $C_{305}$, inductors $L_{301}$ and $L_{302}$, and resistors $R_{301}$ and $R_{302}$. An amplified signal from this amplifier is mixed with the output signal from the second local oscillator 19 by means of a mixing circuit which includes a transistor $Q_{302}$, capacitors $C_{306}$ to $C_{310}$, inductors $L_{304}$ to $L_{306}$, resistors $R_{303}$ to $R_{309}$. The mixing circuit generates a second IF signal having an intermediate frequency of 45 MHz band.

The second local oscillator 19 comprises a fixed oscillator having an AFC function. This oscillator includes a transistor $Q_{303}$, capacitors Cphd 313 to $C_{321}$, a varactor diode $D_{301}$, inductors $L_{308}$ to $L_{311}$ and resistors $R_{309}$ to $R_{311}$. The AFC signal is supplied to a terminal 19a. The oscillating frequency of the second local oscillator 19 is set at 1,457 MHz.

The second IF signal from the second mixer 20 is amplified and filtered by the second IF circuit 21. A resultant signal appears at the output terminal 22. The second IF circuit 21 comprises a first amplifier which includes a transistor $Q_{401}$, capacitors $C_{401}$ to $C_{405}$, resistors $R_{401}$ to $R_{406}$ and an inductor $L_{401}$, a second amplifier which includes a transistor $Q_{402}$, capacitors $C_{413}$ to $C_{417}$, resistors $R_{407}$ to $R_{413}$ and an inductor $L_{403}$, and a second IF filter which is connected between the first and second amplifiers and which includes capacitors $C_{407}$ to $C_{411}$, piezonators $X_{401}$ and $X_{402}$ and an inductor $L_{402}$.

According to the circuit arrangement described above, a high performance, represented by a total gain of $33\pm 2$ dB, and a noise figure of less than 10 dB can be accomplished by small dimensions of $100\times 60\times 20$ mm, which corresponds to a volume of less than 132 cm$^3$. In addition, the interference characteristics can be improved by diode single balanced mixers in such a manner that cross modulation characteristics are represented by $-60$ dB.

A TV receiver having the tuner shown in FIG. 2 will be described with reference to FIG. 9.

Figure 9:
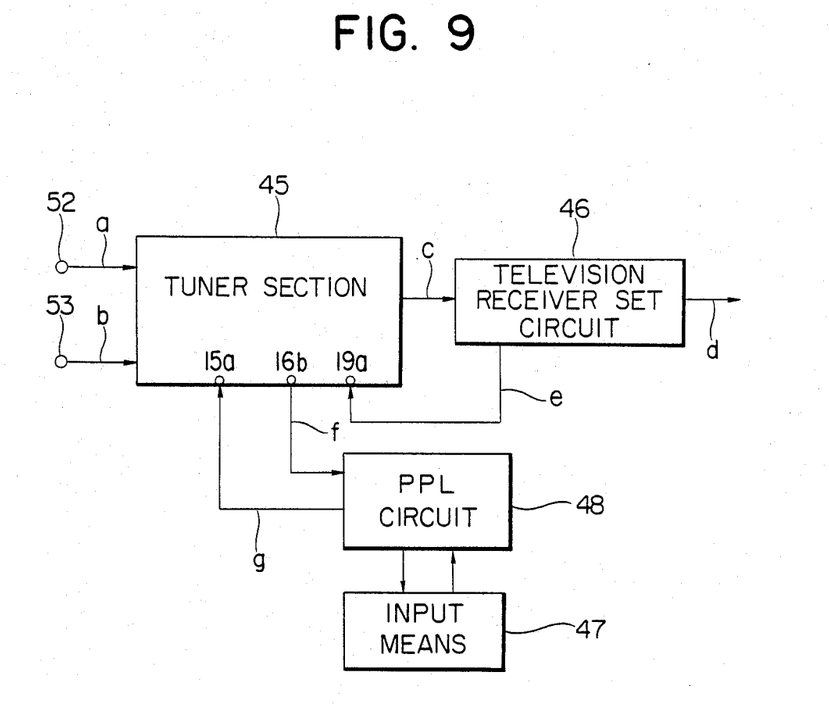
FIG. 9 is a block diagram of a receiver using the tuner shown in FIG. 2.

The tuner shown in FIG. 2 is used as a tuner section 45 in FIG. 9. As has been described with reference to FIG. 2, the two input signals a and b are supplied to the tuner section 45 through the input terminals 52 and 53. An output c from the tuner section 45 is processed by a television receiver set circuit 46 in accordance with predetermined signal processing, thereby obtaining a video signal d. An AFC signal e supplied from the television receiver set circuit 46 is supplied to the tuner section 45 to stabilize the operation of the television receiver set circuit 46.

On the other hand, tuning of a reception channel is performed by a PPL synthesizer. When a tuning signal is entered by a keyboard or tuning button in an input means 47, a PPL circuit 48 frequency-divides a frequency signal f from the tuner section 45 and compares a frequency-divided signal with a reference frequency. The PPL circuit 48 then supplies an error signal g to the tuner section 45, thereby phase-locking the VCO of the tuner section 45 so as to stabilize the operation thereof.

Figure 10:
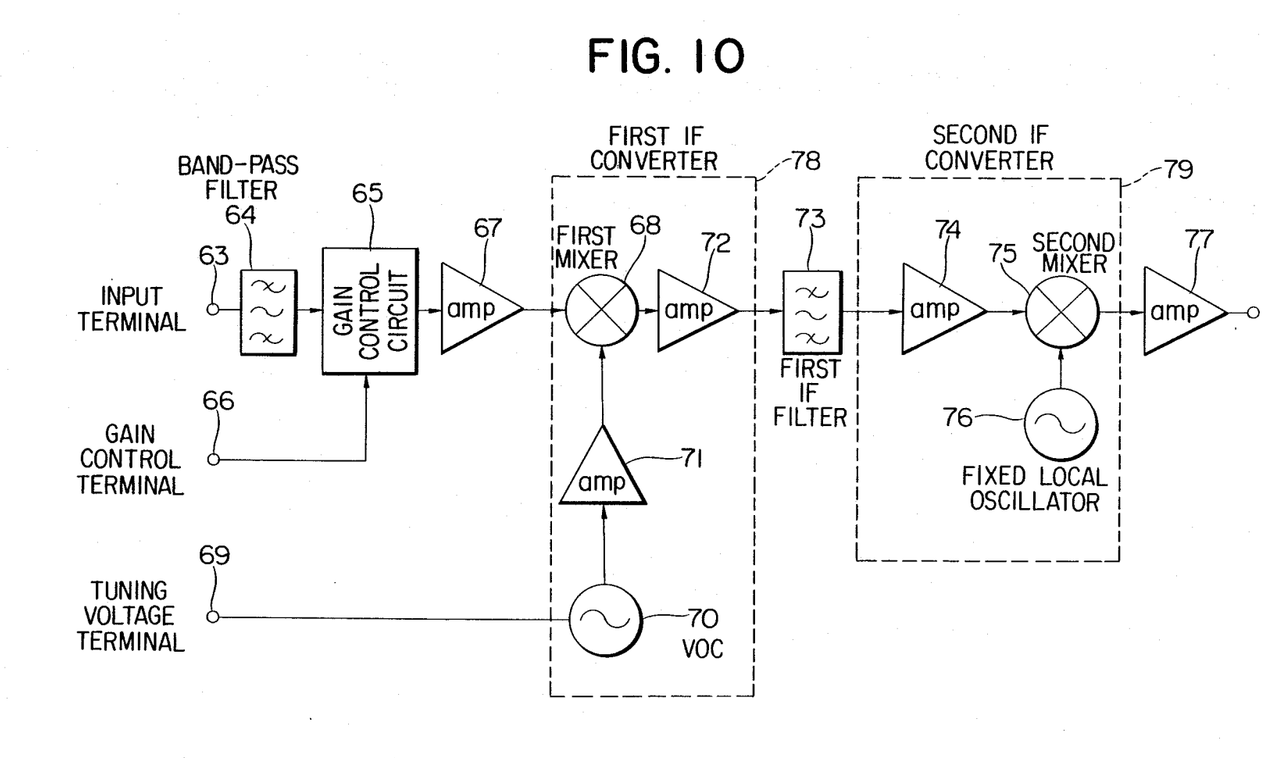
FIG. 10 is a block diagram of a tuner according to another embodiment of the present invention.

FIG. 10 is a block diagram of a tuner according to another embodiment of the present invention.

Referring to FIG. 10, reference numeral 63 denotes an input terminal for receiving a TV signal; 64, a band-pass filter; 65, a gain control circuit for controlling a gain in response to a level of a voltage at a gain control terminal 66; and 67, an input signal amplifier which amplifies an output from the gain control circuit 65.

Reference numeral 68 denotes a first mixer for mixing an output from a first local oscillator (to be described later) with the amplified input signal and generating a first IF signal; 70, a VCO for generating a first oscillation signal in response to a voltage applied to a tuning voltage terminal 69; 71, a buffer amplifier for amplifying the first local oscillation signal and supplying an amplified signal to the first mixer 68; and 72, a first intermediate amplifier for amplifying an output from the first mixer 68. The first mixer 68, the VCO 70, the buffer amplifier 71 and the first intermediate amplifier 72 constitute a first IF converter 78.

Reference numeral 73 denotes a first IF filter; 74, a first IF amplifier; and 75, a second mixer for mixing the second local oscillation signal from a fixed local oscillator 76 with the output from the first IF amplifier 74 and frequency-converting the output from the first IF amplifier 74 to a signal having a second intermediate frequency ($f_{I2}$). The first IF amplifier 74, the second mixer 75 and the fixed local oscillator 76 constitute a second IF converter 79.

Reference numeral 77 denotes a second IF amplifier for amplifying the output from the second mixer 75 and supplying an amplified signal to a tuner (not shown).

The operation of the tuner having the arrangement described above will be described hereinafter.

The TV signal is supplied to the input terminal 63. An unnecessary channel component of the input TV signal is removed by the band-pass filter 64. A gain of a filtered signal from the band-pass filter 64 is controlled by the gain control circuit 65 in response to the level of a signal supplied to the gain control terminal 66 so as to obtain a proper level for the tuner when a large signal is supplied. An output from the gain control circuit 65 is amplified by the input signal amplifier 67, and an amplified signal is supplied to the first mixer 68. The first mixer 68 mixes as the first local oscillation signal an output from the buffer amplifier 71 for amplifying the oscillation output ($f_{L1}$) from the VCO 70 controlled by the voltage supplied to the tuning voltage terminal 69 with the signal from the input signal amplifier 67 so as to perform frequency conversion, thereby obtaining the first IF signal. This output from the first mixer 68 is amplified by the first intermediate amplifier 72. An interference frequency component of the amplified signal is removed by the first IF filter 73. The interference component-filtered first IF signal is amplified by the first IF amplifier 74. An output from the first IF amplifier 74 is frequency-converted by the second mixer 75 to a second IF signal ($f_{I2}$) by using the oscillation output from the fixed local oscillator 76 as the second local oscillator. The resultant signal is amplified by the second IF amplifier 77 by using the standard intermediate frequency in the standard TV system, thus providing a tuner output.

In the double converter TV tuner having the arrangement described above, the first and second IF amplifiers 72 and 74 are arranged to compensate for the increase in noise figure (NF) due to a filtering loss of the first IF filter 73, thereby obtaining a proper gain with less interference.

In addition, since the first IF converters 78 and 79 are arranged on different circuit boards, the frequency interference therebetween can be prevented.

Figure 11:
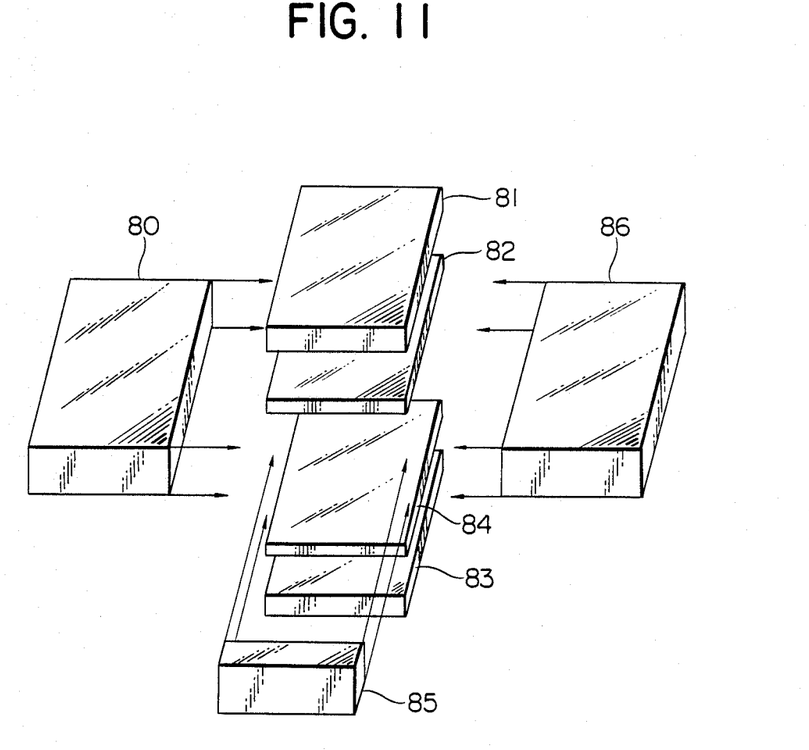
FIG. 11 is an exploded perspective view of the respective blocks of the tuner shown in FIG. 10.

FIG. 11 shows the arrangement for shielding the respective components from interference components.

Referring to FIG. 11, a circuit board 80 has the input terminal 63, the band-pass filter 64, the gain control circuit 65, the gain control terminal 66, and the input signal amplifier 67 thereon. A circuit board 81 has the first IF converter 78 (i.e., the first mixer, 68, the tuning voltage terminal 69, the VCO 70, the buffer amplifier 71 and the first IF amplifier 72, as shown in FIG. 10) thereon. A shielding plate 82 is attached on the lower surface of the circuit board 81. A circuit board 83 has the second IF converter 79 (i.e., the first intermediate amplifier 74, the second mixer 75 and the fixed local oscillator 76, as shown in FIG. 10) thereon. A shielding plate 84 is attached to the upper surface of the circuit board 83. The shielding plates 82 and 84 of the circuit boards 81 and 83 are brought into contact with each other. The first IF filter 73 is arranged as a base 85. It should be noted that a single shielding sheet may constitute a shielding means in place of two shielding sheets. The second IF amplifier 77 shown in FIG. 2 is arranged on an output circuit board 86.

According to the arrangement described above, the input signal flows through the components on the circuit boards 80, 81, the base 85, and the circuit board 83 in the order named and is generated at the output circuit board 86.

According to the arrangement shown in FIG. 11, in the double converter tuner, the first IF converter 78 is completely isolated from the second IF converter 79 by a simple construction such as shielding plates 82 and 84, thereby providing complete shielding and hence preventing the frequency interference between the first IF converter 78 and the second IF converter 79.

Figure 12:
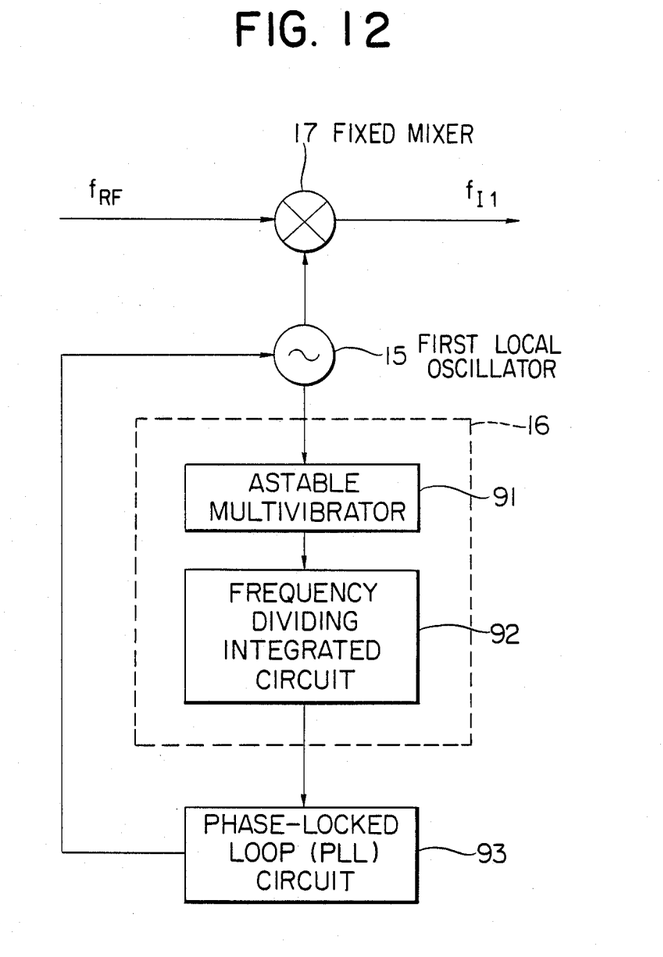
FIG. 12 is a block diagram showing another arrangement of the first local oscillator of the tuner according to the present invention.

FIG. 12 shows another arrangement of the first local oscillator 15 and the fixed frequency divider 16.

As shown in FIG. 12, a first local oscillation output ($f_L$) generated from a first local oscillator 15 is mixed by the first mixer 17 with an input ($f_{Rf}$) to the first mixer 17 and is converted to a first IF signal ($f_{I1}$).

On the other hand, a fixed frequency divider 16 comprises an astable multivibrator 91 and a frequency dividing integrated circuit 92. An output from the first local oscillator 15 is frequency-divided by the astable multivibrator frequency divider 91 by 2 or 4. A frequency-divided signal is then further divided by the frequency dividing integrated circuit 92.

The total frequency division ratio is selected to be compatible with a phase-locked loop (PLL) circuit 93 including a variable frequency divider. The first intermediate frequency ($f_{I1}$) is selected to fall within the range of about 1 to 2 GHz. The frequency divider arrangement selects a value of a power of two within the fixed frequency division ratio determined in accordance with the maximum input frequency and the input frequency range. A possible frequency ratio is 1/128, 1/256, or 1/512.

According to the above arrangement, the astable multivibrator 91 constitutes an input stage of the fixed frequency divider 16, and the frequency dividing integrated circuit 92 constitutes an output stage thereof. When a TV tuner using a higher first intermediate frequency is adopted, the frequency division can be directly performed. Spurious components can be eliminated without using a multiplier and a mixer.

What is claimed is:

1. A tuner comprising:
    an input circuit having first band controlling means for performing first band control with respect to an input signal, automatic gain controlling means for automatically gain-controlling an output from said first band controlling means, and input signal amplifying means for amplifying an ouput from said automatic gain controlling means;
    first intermediate frequency converting means for converting an output signal from said input circuit to a first intermediate frequency signal having a frequency higher than a frequency of the input signal;
    said input circuit further including second band controlling means connected between said input signal amplifying means and said first intermediate frequency converting means for reducing an interference wave caused by distortion of said first intermediate frequency converting means, by performing second band control with respect to an output from said input signal amplifying means, with the band of said second band controlling means being variable and narrower than the band of said first band controlling means;

a first intermediate frequency circuit including a first amplifier-filter-amplifier arrangement having first means for amplifying said first intermediate frequency signal from said first intermediate frequency converting means, means for performing third band control with respect to an output from said first means for amplifying, and second means for amplifying an output from said third band controlling means;

second intermediate frequency converting means for converting an output signal of said first intermediate frequency circuit to a second intermediate frequency signal; and a second intermediate frequency circuit including a second amplifier-filter-amplifier arrangement having third means for amplifying said second intermediate frequency signal from said second intermediate frequency converting means, means for performing fourth band control with respect to an output from said third means for amplifying, and fourth means for amplifying output from said fourth band controlling means;

whereby said second band controlling means and said first and second amplifier-filter-amplifier arrangements greatly reduce interference waves and cross-modulation characteristics.

2. A tuner according to claim 1, wherein a switching circuit is added to an input terminal of said input circuit so as to select one of two input signals.

3. A tuner according to claim 1, wherein said input signal amplifying means in said input circuit comprises a push-pull amplifier.

4. A tuner according to claim 1, wherein said second band controlling means in said input circuit comprises a first filter having a bandwidth of 54 MHz to 102 MHz, a second filter having a bandwidth of 102 MHz to 252 MHz, a third filter having a bandwidth of 252 MHz to 456 MHz, and selecting means for selecting one of said first, second and third filters.

5. A tuner according to claim 1, wherein said second band controlling means in said input circuit comprises a first filter having a bandwidth of 54 MHz to 102 MHz, a second filter having a bandwidth of 102 MHz to 282 MHz, a third filter having a bandwidth of 282 MHz to 456 MHz, and selecting means for selecting one of said first, second and third filters.

6. A tuner according to claim 1, wherein said second band controlling means in said input circuit comprises a first filter having a bandwidth of 54 MHz to 108 MHz, a second filter having a bandwidth of 108 MHz to 282 MHz, a third filter having a bandwidth of 282 MHz to 456 MHz, and selecting means for selecting one of said first, second and third filters.

7. A tuner according to claim 1, wherein said first intermediate frequency converting means comprises a local oscillator controlled by a varactor diode to produce a first oscillation signal, and means for converting said output from said input circuit to said first intermediate frequency in response to said first oscillation signal.

8. A tuner according to claim 1, wherein said first intermediate frequency converting means comprises a diode balanced mixer for generating an intermediate frequency of 1,400 MHz to 1,600 MHz.

9. A tuner according to claim 1, wherein said first intermediate frequency converting means comprises a local oscillator, a mixer, and an amplifier for amplifying an output from said local oscillator and supplying an amplified signal to said mixer.

10. A tuner according to claim 1, wherein said amplifying means in said second intermediate frequency circuit comprise high-frequency push-pull amplifiers, respectively.

11. A tuner according to claim 1, wherein said second intermediate frequency circuit comprises a band-pass filter for performing the fourth band control.

12. A tuner according to claim 1, wherein said second intermediate frequency circuit comprises a band-pass filter for passing the second intermediate frequency signal and a band blocking filter for removing an interference wave excluding a desired bandwidth.

13. A tuner according to claim 1, wherein said first intermediate frequency converting means is arranged on a first circuit board, said second intermediate frequency converting means is arranged on a second circuit board, and said first intermediate frequency circuit is arranged between said first and second circuit boards.

14. A tuner according to claim 1, wherein said first intermediate frequency converting means comprises a local oscillator for producing a first oscillation signal and a fixed frequency divider supplied with said first oscillation signal, said fixed frequency divider being constituted by a first frequency divider of an astable multivibrator supplied with said first oscillation signal and a second frequency divider of a frequency dividing integrated circuit supplied with an output of said first frequency divider, and a total fixed frequency ratio being set to be one of 1/128, 1/256 and 1/512.

15. A tuner according to claim 14, wherein said first frequency divider has a frequency division ratio of ½.

16. A tuner according to claim 14, wherein said first frequency divider has a frequency division ratio of ¼.

17. A tuner according to claim 1, wherein:

said first intermediate frequency converting means includes a first local oscillator, a first amplifier for amplifying an output from said first local oscillator, a first mixer for mixing an output signal from said first amplifier with an input signal supplied to said tuner to convert the input signal to a first intermediate frequency signal, said first means for amplifying operating to amplify an output from said first mixer;

said means for performing third band control passing a desired band of the first intermediate frequency signal from said first intermediate frequency converting means; and said second intermediate frequency converting means includes a second local oscillator, a third amplifier for amplifying an output from said second local oscillator, and a second mixer for mixing an output signal from said second means for amplifying with a signal from said means for performing third band control and converting the signal generated from said means for performing third band control to a second intermediate frequency signal, said first and second intermediate frequency converting means being arranged on first and second circuit boards, respectively, and said means for performing third band control being arranged between said first and second circuit boards.

18. A tuner according to claim 17, wherein said first local oscillator is connected to a fixed frequency divider, said fixed frequency divider being constituted by a first frequency divider of an astable multivibrator connected with said first local oscillator and a second frequency divider of a frequency dividing integrated circuit connected with said first frequency divider, a total fixed frequency division ratio being one of 1/128, 1/256 and 1/512.

19. A tuner according to claim 17, wherein said first frequency divider has a frequency division ratio of ½.

20. A tuner according to claim 17, wherein said first frequency divider has a frequency division ratio of ¼.

21. A tuner according to claim 17, wherein the input signal to said first mixer is an output from a push-pull amplifier.

* * * * *